United States Patent [19]

Frisbie et al.

[11] Patent Number: 4,515,505
[45] Date of Patent: May 7, 1985

[54] PRESSURE FOOT ASSEMBLY FOR AN END MILL DELETE CUTTER

[75] Inventors: Richard C. Frisbie, Vestal; David E. Houser, Apalachin; Richard J. Morenus, Endwell; Edwin L. Thomas, Apalachin, all of N.Y.

[73] Assignee: International Business Machines Corporation, Armonk, N.Y.

[21] Appl. No.: 437,421

[22] Filed: Oct. 28, 1982

[51] Int. Cl.³ .............................. B23C 1/06; B23C 9/00
[52] U.S. Cl. ................................. 409/163; 144/134 A; 408/112; 408/97; 409/184
[58] Field of Search ............... 409/80, 134, 163, 137, 409/197, 178, 179, 182, 190, 235, 184; 408/95, 110, 112, 97; 144/134 D, 134 A, 136 C

[56] References Cited

U.S. PATENT DOCUMENTS

| | | | |
|---|---|---|---|
| 3,332,462 | 7/1967 | Williams | 144/136 C X |
| 4,158,987 | 6/1979 | Smith | 409/80 |
| 4,185,378 | 1/1980 | Machida | 29/626 |
| 4,244,669 | 1/1981 | Puritz et al. | 409/137 |
| 4,251,174 | 2/1981 | Satler et al. | 409/137 |

FOREIGN PATENT DOCUMENTS 2107591 8/1972 Fed. Rep. of Germany.
1369029 10/1974 United Kingdom.

Primary Examiner—Z. R. Bilinsky
Attorney, Agent, or Firm—John H. Bouchard

[57] ABSTRACT

A pressure foot assembly is provided which makes use of a pressure ring mounted in a manner which allows it to float laterally around an end mill cutter which is used to delete circuit lands on a subcomposite printed circuit panel. Enough pressure is provided to keep the ring from rotating and allows the ring to impart a concentrated force very close around the cutter, thus holding the deleted circuit line in place during cutting and keeping cutting burrs to a minimum.

3 Claims, 4 Drawing Figures

PRESSURE FOOT ASSEMBLY FOR AN END MILL DELETE CUTTER

BACKGROUND OF THE INVENTION

In printed circuit board technology, a multilayer circuit board comprises several subcomposite panels having printed circuitry and which are laminated to provide a composite board. The printed circuitry comprises circuit lands or pads to which are connected one or more circuit lines. To repair any shorted or open circuits or to make an engineering change, a plunge end mill cutter is used to delete circuit lands only on the top surface of the board. The top surface of the board has a protective coating applied thereto and, as a result, there is no disturbance or delamination of the circuit line or lines connected to the circuit land during its deletion operation.

It has become desirable to make, what is termed in the art, an early net repair which involves changing the circuitry on a subcomposite panel before it is laminated in the process of assemblying a composite multilayer circuit board. This is also done by using a plunge end mill cutter to delete the desired circuit lands on the panel. However, in this case, the subcomposite or internal panel is not provided with a protective coating and, as a result, the circuit line or lines connected to the land being deleted have a tendency to rise or delaminate from the panel during the delete operation which creates an intolerable condition. It became evident that some means was needed to prevent the delamination of circuit line during a delete operation on a sub-composite circuit panel.

SUMMARY OF THE INVENTION

The present invention provides a pressure foot assembly for a rotatable end mill delete cutter mounted to a vertically movable slide assembly used to delete circuit lands which are connected to circuit lines on a printed circuit panel. The assembly comprises a pressure foot which is attached to the slide assembly. A thrust ball bearing assembly is contained within a cylindrical cavity in the bottom of the pressure foot and a pressure ring is contained within the cavity and adjacent to the ball bearing assembly. A retainer ring is provided which is attached to the bottom of the pressure foot and spring means are contained and compressed between the pressure ring and retainer ring to support the pressure ring up against the ball bearing assembly. A clearance area is provided around the periphery of the pressure ring which allows the inside diameter to float into a concentric position around the delete cutter with the pressure ring being effective to contact circuit lines and keep them in place when the circuit land or pad to which they are connected is being deleted by the delete cutter.

A unique feature of the present invention is the mounting of the pressure ring which allows it to float laterally around the delete cutter, but still imparts enough pressure to keep it from rotating. This feature allows the small ring to impart a concentrated force very close around the cutter, thus holding the deleted circuit line in place during cutting and keeping cutting burrs to a minimum.

Another feature is the truncated cone type shape of the pressure ring so that the vertical contact force imparted to the small projecting ring is transmitted to the larger out-board contact points of the thrust bearing balls. This prevents tilting of the pressure ring during contact with a portion of the circuit lands.

Accordingly, a primary object of the present invention is to provide a novel pressure foot assembly for a rotatable end mill cutter used to delete circuit land pads on a printed circuit panel.

Another object of the present invention is to provide a novel pressure foot assembly for a rotatable end mill cutter used to delete circuit land pads on a printed circuit panel and which includes a pressure ring the inside diameter of which floats into a concentric position around the delete cutter and which is effective to keep in place printed circuit lines connected to a land during a delete operation.

A further object of the present invention is to provide a novel pressure foot assembly as set forth in the proceeding object and including means for preventing tilting of the pressure ring during contact with a portion of the circuit land being deleted.

The foregoing and other objects, features and advantages of the invention will be apparent from the following more particular description of a preferred embodiment of the invention, as illustrated in the accompanying drawings.

DESCRIPTION OF PREFERRED EMBODIMENT

Figure 1:
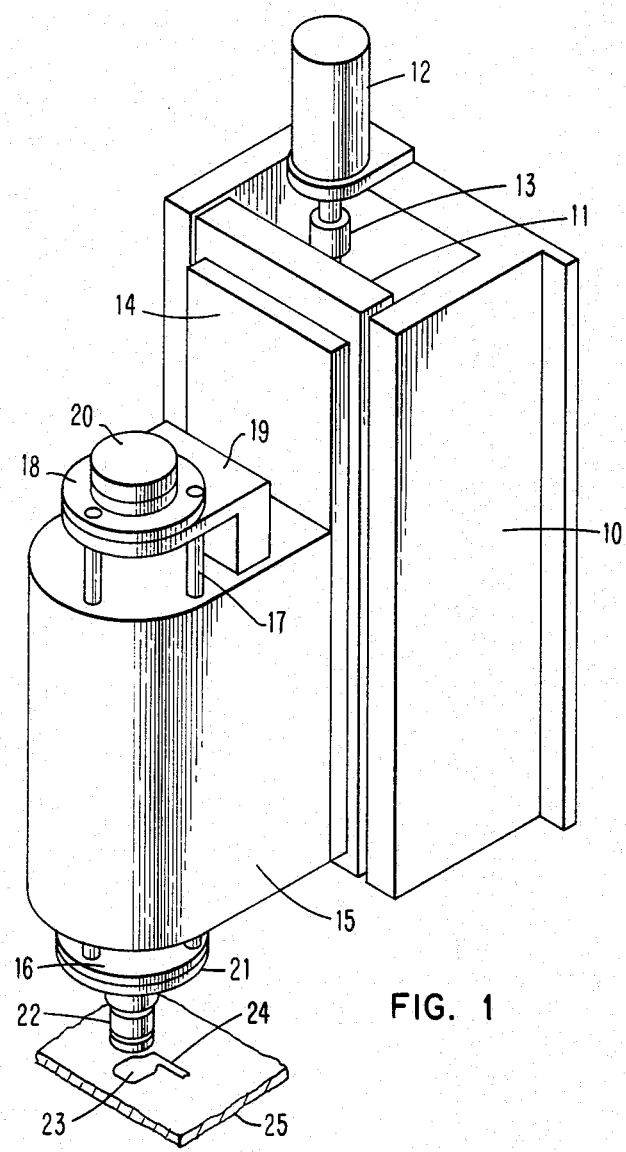
FIG. 1 is an isometric view illustrating an end mill delete machine to which the pressure foot assembly of the present invention is applied.

Referring to FIG. 1, there is broadly illustrated an end mill delete cutting machine to which the pressure foot assembly of the present invention is applied. Briefly, the machine comprises a U-shaped support block 10 to which is mounted by means of cross-roller bearings, not shown, a vertically movable slide plate 11. Mounted on the support block is a computer controlled reversible DC motor 12 which drives a lead screw 13. The lead screw co-acts with a conventional internally threaded nut assembly, not shown, which is attached to the side of the slide plate 11 whereby operation of the DC motor 12 will result in upward and downward movement of the slide plate.

Attached to the slide plate 11 is a mounting plate 14 and attached to this mounting plate is a delete end mill cutter spindle assembly 15. Since the present invention relates to a pressure foot assembly, the cutter spindle assembly need not be described in detail. A vertically movable external slide assembly is provided which comprises a slide ring 16 attached to three shafts 17 which can travel upwards and are guided by two sets of ball bushings. This external slide assembly is attached at the top by a support ring 18 which also serves as the vertical down stop against a stop block 19. The support ring 18 is also the attachment member from the external slide assembly to the internal spindle/cutter portion of the mechanism.

The spindle/cutter is suitably mounted in an air bearing and is rotated by a computer controlled DC motor. The spindle/cutter may be manually adjusted vertically by means of a knob 20 attached to a lead screw and bearing slide assembly to set the depth of cut to be made by the cutter.

Attached to the slide ring 16 by means of a mounting ring 21 is the pressure foot assembly 22. The support block 10 is mounted on a conventional X-Y table which moves the entire assembly to position the delete cutter and pressure foot assembly into alignment with a selected circuit land 23 and the printed circuit line 24 to carry out a delete operation on the subcomposite printed circuit panel 25.

Figure 2:
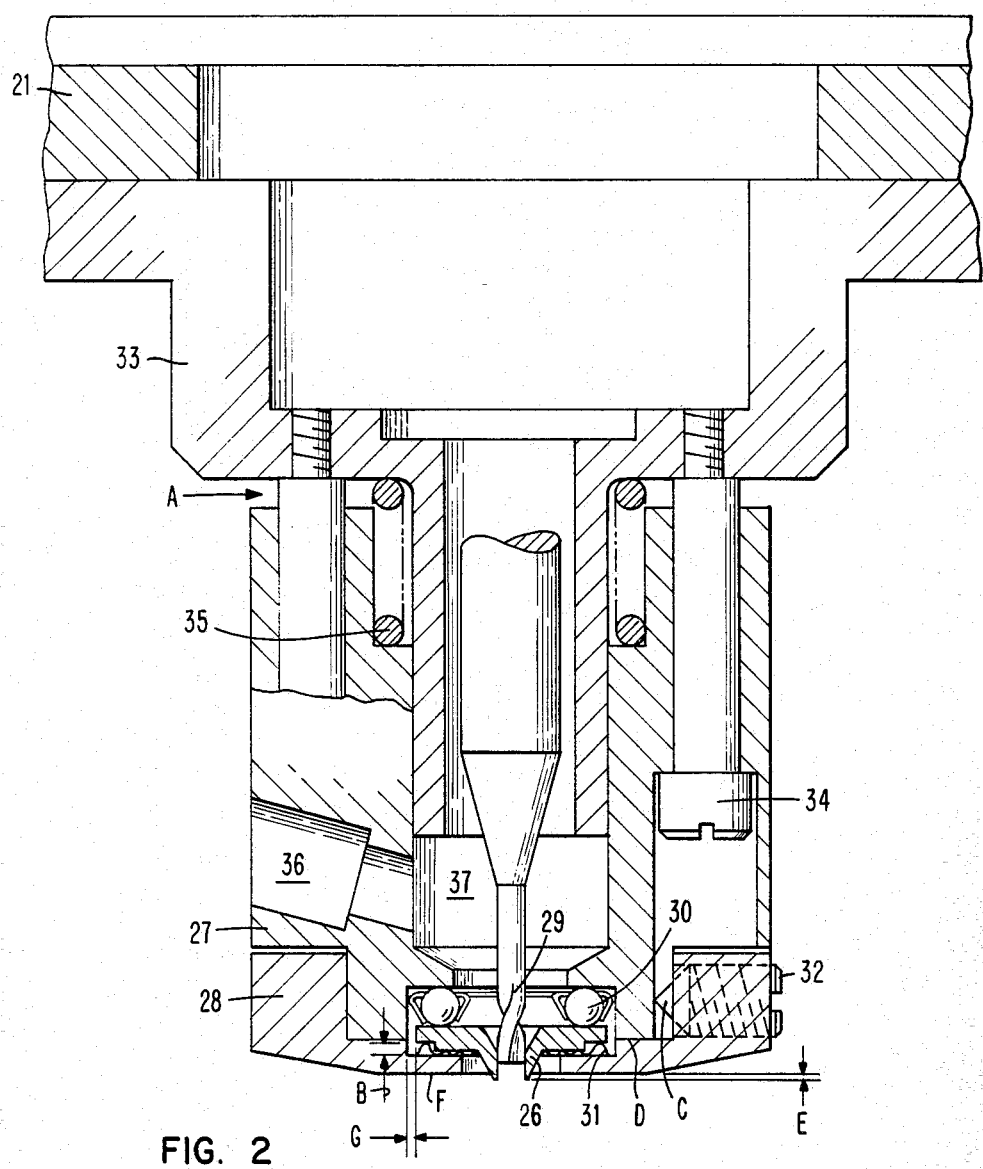
FIG. 2 is a sectional view of the pressure foot assembly of the present invention.

Referring now to FIG. 2, the pressure foot assembly comprises a pressure ring 26 which is retained within a cylindrical area formed by counterbore diameter in a pressure foot 27 and retainer ring 28. Clearance area G around the ring periphery allows the inside diameter to float into a concentric position around the delete cutter 29 of the spindle assembly 15 (FIG. 1). The pressure ring 26 is supported upwards against a thrust ball bearing assembly 30 by a wave spring washer 31 which is contained and compressed to a distance B by retainer ring 28. This retainer ring mounts to the pressure foot 27 by means of a close fitting diameter and is retained by three "V" screws 32 which, when tightened, contact the lower surface C of a cylindrical "V" groove in this diameter. This attachment method allows for quick removal of the retainer ring yet assures contact at point D. The means by which the various parts are mounted and dimensioned provides for a repeatable projection E of the pressure ring from surface F as they are replaced due to wear.

The pressure foot 27 is attached to a spindle stop 33 by two shoulder screws 34 and is guided by the shoulder screws and a slip fit diameter on the spindle stop. The shoulder screws allow a travel of gap A, for example, 0.5 mm between the spindle stop and pressure foot with a spring 35 imparting a downward force during this travel. The spindle stop 33 is concentrically mounted to the mounting ring 21 which has a projecting concentric ring to provide repeatable housing to the slide ring 16 on the spindle assembly. A vacuum duct 36 is connected to a suitable vacuum source to remove deletion debris from the spindle cavity 37.

Figure 3:
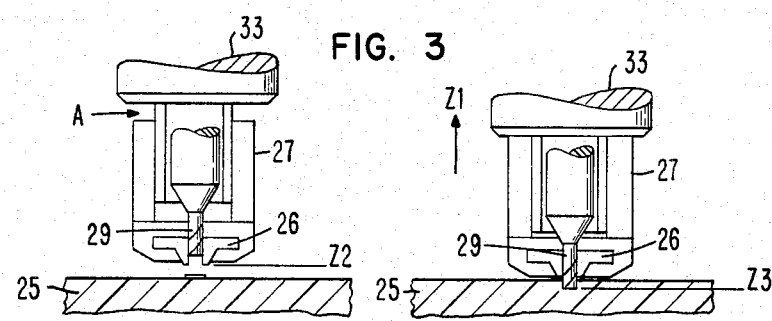
FIG. 3 is a schematic showing of the delete cut operation.

Referring to FIG. 3, there is shown schematically how a typical delete cut is made. The spindle assembly is mounted on the vertically driven Z linear axis slide 11 on the machine which drives it to the Z position shown. A position Z1 is an upper rest position which allows clearance for the printed circuit panel 25 during positioning by the X-Y table. At the start of a typical delete cycle, the slide plate 11 is programmed to drive approximately 20 mm downwards and to stop at position Z2 which is 0.5 mm above the surface of the panel. At this point, the rate of vertical feed is changed for the actuaL cutting stroke. Next, the mechanism moves down 0.5 mm to where the pressure ring 26 contacts the printed circuit panel, the circuit land to be deleted and its associated circuit line.

During the next 0.5 mm of travel, the spring loaded pressure ring assembly closes gap A between the spindle stop 33 and pressure foot 27 performing the delete by allowing the cutter 29 to protrude past the pressure ring to a depth determined by a depth setting adjustment on the spindle assembly. The last 0.5 mm of travel is over-travel taken up by the spring loaded slide assembly of the main spindle assembly to compensate for varying thickness of circuit panels. This is done by allowing the pressure foot and the cutter to rise (over-travel) together as a unit. At this Z3 point, the Z axis slide plate 11 is programmed to drive back up to the Z1 position.

Figure 4:
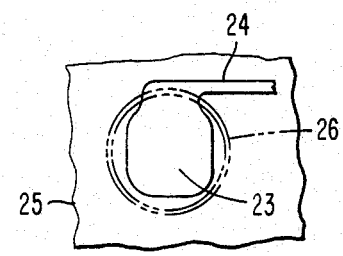
FIG. 4 is a plan view showing the relationship between the floating pressure ring and a circuit land having a circuit line connected thereto.

FIG. 4 shows the relationship between the floating pressure ring 26 and the circuit land 23 having the circuit line 24 connected thereto during a delete cut operation. Referring to FIG. 2, the projection E of the pressure ring from surface F allows the ring to imbed into the copper circuit land a controlled amount while surface F provides a down stop of sufficient surface area so as not to cause damage to surrounding circuit lines.

The very small surface area of the pressure ring is dictated partly by the clearance area left between possible adjacent circuit lines and the delete cutter required to remove the circuit land. For example, this distance may be 0.003 inches from the cutting edge so that after allowing for various machine tolerances, a projecting ring width of 0.0005 to 0.001 inches can be used. This could be increased somewhat in a different product geometry. Also, the pressure ring should be made of a material which will withstand moderate impact and high wear. A preferred material which may be used is high speed steel hardened to 65-70 R.C.

While the invention has been particularly shown and described with reference to a preferred embodiment thereof, it will be understood by those skilled in the art that various changes in form and detail may be made therein without departing from the spirit and scope of the invention.

What is claimed is:

1. A pressure foot assembly for a rotatable end mill delete cutter mounted on a vertically movable slide assembly used to delete circuit land pads which are connected to circuit lines on a printed circuit panel, comprising:

pressure foot means attached to said slide assembly for receiving a cutter means therein, a cavity being defined by the boundaries of said pressure foot means in the bottom thereof;

spring biased pressure ring means including a hole disposed through the approximate center thereof and retained within said cavity of said pressure foot means for holding said circuit lines in place while said cutter means deletes at least a portion of the circuit line pad connected thereto, an inner surface of said hole being in substantial contact with said cutter means when said cutter means is disposed therein, the periphery of said pressure ring means and an inner surface of said pressure foot means defining a clearance area, said pressure ring means utilizing said clearance area to float within said cavity in order to maintain a concentric position with respect to said cutter means and to firmly hold said cutter means, said pressure ring means floating into said concentric position with respect to said cutter means when said pressure ring means contacts said circuit lines and maintaining said lines in place while the circuit land pad connected thereto is being deleted by said cutter means;

thrust ball bearing assembly means contained within said cavity and disposed between said pressure ring means and said pressure foot means for permitting said pressure ring means to float laterally within said cavity;

retainer ring means attached to the bottom of said pressure foot means; and spring means disposed and compressed between said pressure ring means and said retainer ring means for supporting said pressure ring means up against said ball bearing assembly means.

2. A pressure foot assembly as set forth in claim 1 wherein the bottom portion of said pressure ring means projects from the bottom surface of said retainer ring means to allow the pressure ring means to imbed in a circuit land a controlled amount while the bottom surface of the retainer ring means provides a down stop of sufficient area so as not to cause damage to surrounding circuit lines.

3. A pressure foot assembly as set forth in claim 2 wherein said pressure ring means has a truncated cone shape with said bottom projecting portion being smaller than the top portion so that the vertical contact force imparted to the smaller projecting portion of the ring means is transmitted through the larger portion to the larger out-board contact points of said thrust ball bearing assembly means to prevent tilting of the pressure ring means during contact with a portion of the circuit lands.

* * * * *